US012676619B2

(12) United States Patent
Du et al.

(10) Patent No.: US 12,676,619 B2
(45) Date of Patent: Jul. 7, 2026

(54) MEDIA COMMUNICATION SYSTEM AND MEDIA COMMUNICATION APPARATUS AND METHOD THEREOF HAVING SIGNAL SYNCHRONIZATION MECHANISM

(71) Applicant: REALTEK SEMICONDUCTOR CORPORATION, Hsinchu (TW)

(72) Inventors: Ming-Jhe Du, Hsinchu (TW); Ming-Hsuan Tsai, Hsinchu (TW); Chun-I Yeh, Hsinchu (TW); Yu-Chong Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 425 days.

(21) Appl. No.: 18/510,710

(22) Filed: Nov. 16, 2023

(65) Prior Publication Data

US 2024/0178847 A1 May 30, 2024

(30) Foreign Application Priority Data

Nov. 29, 2022 (TW) .................................. 111145663

(51) Int. Cl.
*H04W 56/00* (2009.01)
*H03L 7/083* (2006.01)
(Continued)

(52) U.S. Cl.
CPC .............. *H03L 7/083* (2013.01); *H03L 7/089* (2013.01); *H03L 7/091* (2013.01)

(58) Field of Classification Search
None
See application file for complete search history.

(56) References Cited

U.S. PATENT DOCUMENTS 9,787,418 B2 10/2017 Earl et al.
2011/0170644 A1* 7/2011 Iqbal ..................... H04L 7/0337
375/355

(Continued)

FOREIGN PATENT DOCUMENTS

CN 112214065 A 1/2021
TW 202144952 A 12/2021

OTHER PUBLICATIONS

Dave Olsen, IEEE 1722 AVTP(Audio/Video Transport Protocol), Harman International.

(Continued)

*Primary Examiner* — Maharishi V Khirodhar
(74) *Attorney, Agent, or Firm* — WPAT, PC

(57) ABSTRACT

The present disclosure discloses a media communication apparatus having built-in signal synchronization mechanism. A local clock generation circuit generates a reference clock signal and a media clock signal. A time calibration circuit performs time calibration process with an external apparatus to generate time calibration information to further calibrate the reference clock signal and the media clock signal accordingly to generate a calibrated reference clock signal and a calibrated media clock signal on a standard time domain. A media clock processing circuit generates a sampling signal according to the calibrated media clock signal. A signal processing circuit generates time related information according to the calibrated reference clock signal to process an input media signal according to the time related information and the sampling signal and generate an output media signal.

20 Claims, 6 Drawing Sheets

110 (LS1)

(51) Int. Cl.
    *H03L 7/089*        (2006.01)
    *H03L 7/091*        (2006.01)

(56)               References Cited

U.S. PATENT DOCUMENTS

2023/0010155 A1 * 1/2023 Sakaue ................. H04L 7/0016
2023/0341892 A1 * 10/2023 Jiang ......................... G06F 1/14

OTHER PUBLICATIONS

Eric Mann et al., AVB Software Interfaces and Endpoint Architecture Guidelines, Dec. 19, 2013, 2012-2013, AVnu Alliance.
OA letter of a counterpart TW application (appl. No. 111145663) mailed on Sep. 25, 2023.

* cited by examiner

100

110 (TL)

110 (LS1)

500

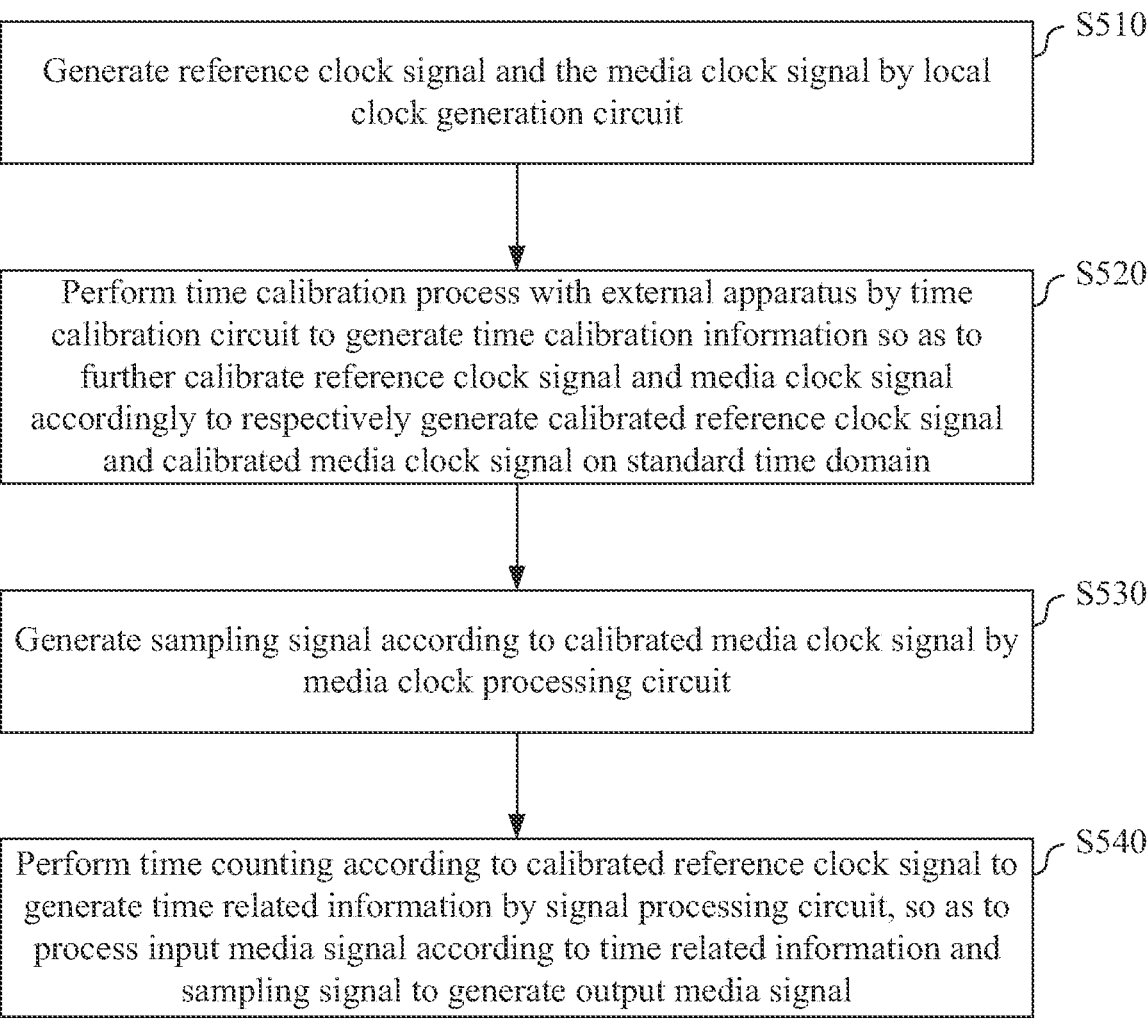

Generate reference clock signal and the media clock signal by local clock generation circuit

S510

Perform time calibration process with external apparatus by time calibration circuit to generate time calibration information so as to further calibrate reference clock signal and media clock signal accordingly to respectively generate calibrated reference clock signal and calibrated media clock signal on standard time domain

S520

Generate sampling signal according to calibrated media clock signal by media clock processing circuit

S530

Perform time counting according to calibrated reference clock signal to generate time related information by signal processing circuit, so as to process input media signal according to time related information and sampling signal to generate output media signal

MEDIA COMMUNICATION SYSTEM AND MEDIA COMMUNICATION APPARATUS AND METHOD THEREOF HAVING SIGNAL SYNCHRONIZATION MECHANISM

BACKGROUND OF THE INVENTION

1. Field of the Invention

The present disclosure relates to a media communication system, a media communication apparatus and a media communication method thereof having built-in signal synchronization mechanism.

2. Description of Related Art

In a media playback system, a media providing terminal and media receiving terminals communicate with each other such that the media providing terminal transmits a media signal to the media receiving terminals to be playbacked. For example, a CD player serving as the media providing terminal may transmit an audio signal to multi-channel amplifiers serving as the media receiving terminals such that the multi-channel amplifiers playback audio according to the audio signal. However, the amplifiers of different channels require a precise signal synchronization mechanism to playback the audio synchronously. In order to accomplish such mechanism, additional circuits are required in the media providing terminal and the media receiving terminals to provide clock signal calibration. Such additional circuits increase the circuit cost.

SUMMARY OF THE INVENTION

In consideration of the problem of the prior art, an object of the present disclosure is to provide a media communication system, a media communication apparatus and a media communication method thereof having signal synchronization mechanism.

The present invention discloses a media communication apparatus having signal synchronization mechanism that includes a local clock generation circuit, a time calibration circuit, a media clock processing circuit and a signal processing circuit. The local clock generation circuit is configured to generate a reference clock signal and a media clock signal. The time calibration circuit is configured to perform a time calibration process with an external apparatus to generate time calibration information so as to further calibrate the reference clock signal and the media clock signal according to the time calibration information to respectively generate a calibrated reference clock signal and a calibrated media clock signal on a standard time domain. The media clock processing circuit is configured to generate a sampling signal according to the calibrated media clock signal. The signal processing circuit is configured to perform time counting according to the calibrated reference clock signal to generate time related information, so as to process an input media signal according to the time related information and the sampling signal to generate an output media signal.

The present invention also discloses a media communication method having signal synchronization mechanism used in a media communication apparatus that includes steps outlined below. A reference clock signal and a media clock signal are generated by a local clock generation circuit. A time calibration process is performed with an external apparatus by a time calibration circuit to generate time calibration information so as to further calibrate the reference clock signal and the media clock signal according to the time calibration information to respectively generate a calibrated reference clock signal and a calibrated media clock signal on a standard time domain. A sampling signal is generated according to the calibrated media clock signal by a media clock processing circuit. Time counting is performed according to the calibrated reference clock signal to generate time related information by a signal processing circuit, so as to process an input media signal according to the time related information and the sampling signal to generate an output media signal.

The present invention further discloses a media communication system that includes a media providing terminal and a plurality of media receiving terminals each including a local clock generation circuit, a time calibration circuit, a media clock processing circuit and a signal processing circuit. The local clock generation circuit is configured to generate a reference clock signal and a media clock signal. The time calibration circuit is configured to perform a time calibration process with an external apparatus to generate time calibration information so as to further calibrate the reference clock signal and the media clock signal according to the time calibration information to respectively generate a calibrated reference clock signal and a calibrated media clock signal on a standard time domain. The media clock processing circuit is configured to generate a sampling signal according to the calibrated media clock signal. The signal processing circuit is configured to perform time counting according to the calibrated reference clock signal to generate time related information, so as to process an input media signal according to the time related information and the sampling signal to generate an output media signal. The output media signal generated by the media providing terminal generate serves as the input media signal of the media receiving terminals.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 5 illustrates a flow chart of a media communication method according to an embodiment of the present invention.

DETAILED DESCRIPTION OF THE PREFERRED EMBODIMENTS

An aspect of the present invention is to provide a media communication system, a media communication apparatus and a media communication method thereof having signal synchronization mechanism to calibrate the reference clock signal and the sampling clock signal to be aligned with a standard time domain by disposing the time calibration circuit such that the generated time related information corresponds to the standard time domain to process the input media signal without an additional time domain conversion circuit. The circuit cost can be greatly reduced.

Figure 1:
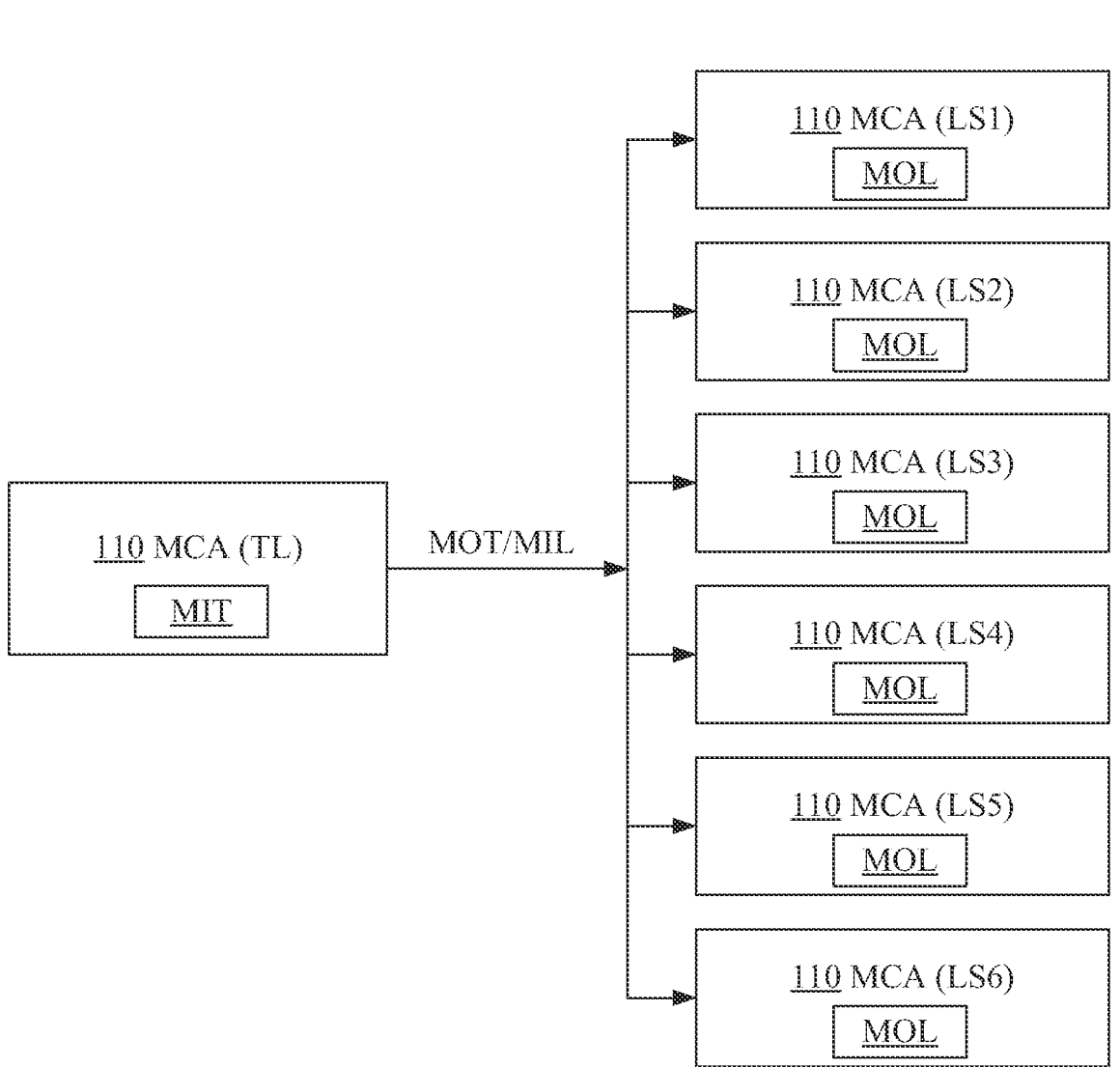
FIG. 1 illustrates a block diagram of a media communication system according to an embodiment of the present invention.

Reference is now made to FIG. 1. FIG. 1 illustrates a block diagram of a media communication system 100 according to an embodiment of the present invention. The media communication system 100 includes a plurality of media communication apparatuses 110 having signal synchronization mechanism. In an embodiment, the media communication apparatuses 110 (abbreviated as MCA in FIG. 1) include a media providing terminal TL (which is called "talker") and six media receiving terminals LS1-LS6 (which are called "listeners").

In a usage scenario, the media providing terminal TL can be such as, but not limited to an audio player or a computer. The media receiving terminals LS1-LS6 can be such as, but not limited to amplifiers each corresponding to mono channel to allow the media receiving terminals LS1-LS6 to form a multi-channel audio playback apparatus. The media receiving terminals LS1-LS6 in FIG. 1 are illustrated as 5.1 channels amplifiers. However, in other embodiments, different numbers of the media receiving terminals can be disposed in the media communication system 100 to correspond to other numbers of channels.

As a result, the media providing terminal TL is configured to process an the input media signal MIT and generate an output media signal MOT. The media receiving terminals LS1-LS6 are configured to receive and process an input media signal MIL to generate an output media signal MOL to be playbacked, wherein the output media signal MOT generated by the media providing terminal TL serves as the input media signal MIL received by the media receiving terminals LS1-LS6.

Figure 2A:
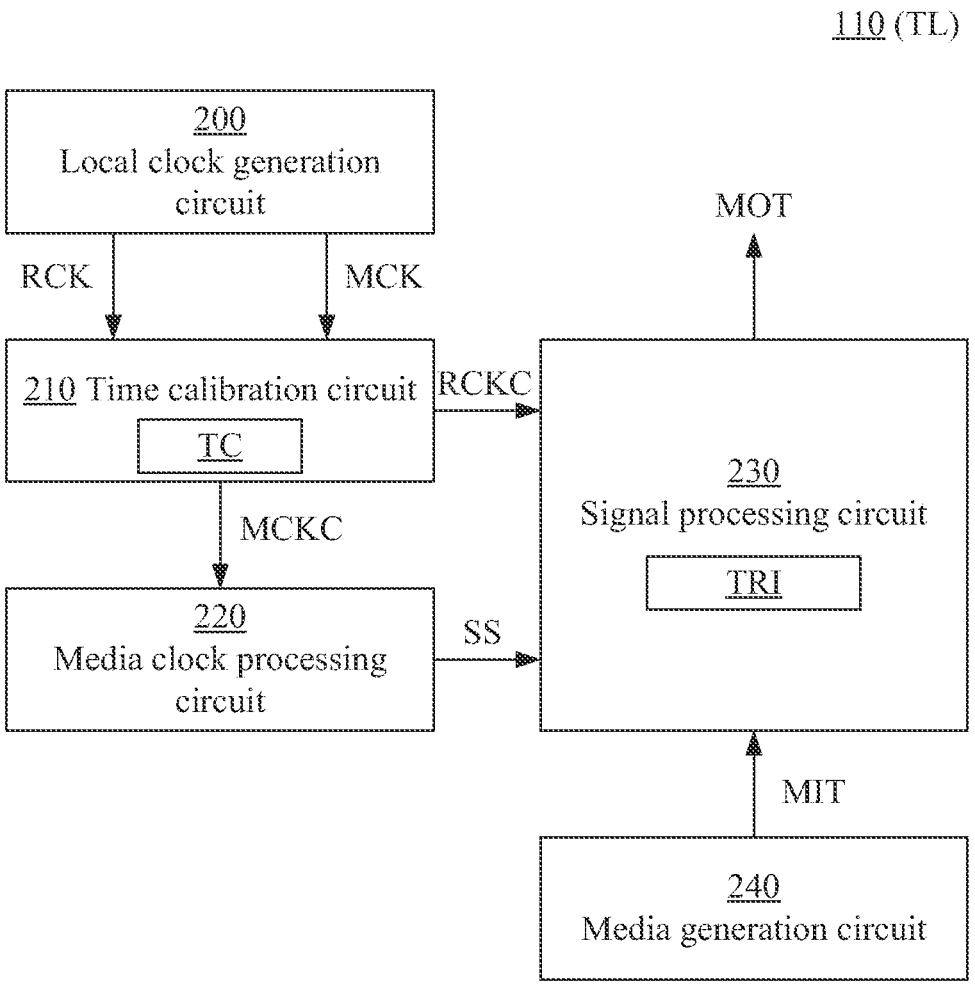
FIG. 2A and FIG. 2B each illustrates a block diagram of a media communication apparatus having signal synchronization mechanism according to an embodiment of the present invention.
Figure 2B:
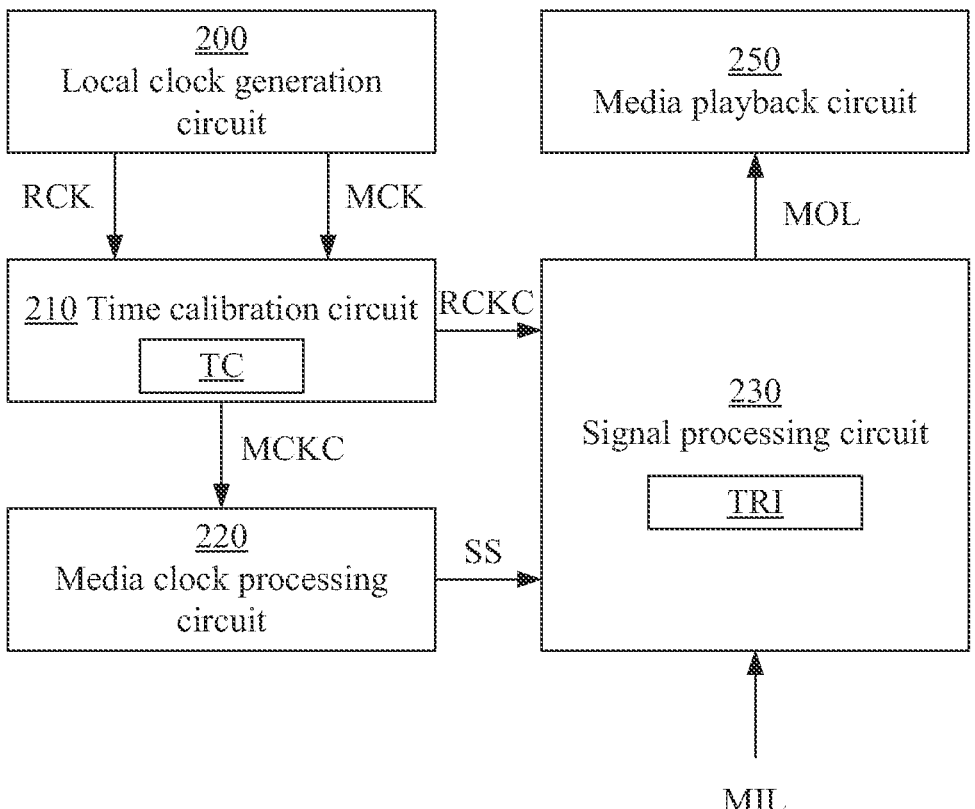

Reference is now made to FIG. 2A and FIG. 2B at the same time. FIG. 2A and FIG. 2B each illustrates a block diagram of a media communication apparatus 110 having signal synchronization mechanism according to an embodiment of the present invention. The media communication apparatus 110 includes a local clock generation circuit 200, a time calibration circuit 210, a media clock processing circuit 220 and a signal processing circuit 230.

The local clock generation circuit 200 is configured to generate a reference clock signal RCK and a media clock signal MCK. In an embodiment, the local clock generation circuit 200 is implemented by an oscillator having a precision higher than a predetermined range, e.g., a crystal oscillator.

The time calibration circuit 210 is configured to perform a time calibration process with an external apparatus (not illustrated) to generate a time calibration information TC so as to further calibrate the reference clock signal RCK and the media clock signal MCK according to the time calibration information TC to respectively generate a calibrated the reference clock signal RCKC and a calibrated the media clock signal MCKC on a standard time domain.

In an embodiment, the time calibration circuit 210 performs the time calibration process with the external apparatus according to a generalized time precision protocol.

More specifically, the external apparatus is a grandmaster apparatus that operates based on a generalized time precision protocol. The time calibration circuit 210 serves as a slave apparatus to perform information exchange, e.g., a path delay request and a path delay response, with the grandmaster apparatus to calculate an average path delay time between the time calibration circuit 210 and the neighboring external apparatus. The time calibration circuit 210 performs further information exchange, e.g., sync information and follow-up information, to calculate a rate ratio between the time calibration circuit 210 and the neighboring external apparatus.

By using the process described above, the time calibration information TC generated by the time calibration circuit 210 may include a clock frequency of the grandmaster apparatus and a time offset amount between the slave apparatus (i.e., the time calibration circuit 210) and the grandmaster apparatus. After being calibrated according to the time calibration information TC, the reference clock signal RCK and the media clock signal MCK become the calibrated the reference clock signal RCKC and the calibrated the media clock signal MCKC that are synchronous with the standard time domain of the grandmaster apparatus.

The media clock processing circuit 220 is configured to generate a sampling signal SS according to the calibrated the media clock signal MCKC. In an embodiment, the media clock processing circuit 220 may be further configured to generate such as, but not limited to a master clock signal (MCLK) and a bit clock signal (BCLK) and provide these clock signals to the circuits that require these clock signals. The present invention is not limited thereto.

The signal processing circuit 230 is configured to perform time counting according to the calibrated the reference clock signal RCKC to generate time related information TRI, so as to process an input media signal according to the time related information TRI and the sampling signal SS to generate an output media signal.

In an embodiment, when being configured to be the media providing terminal TL, the media communication apparatus 110 further includes a media generation circuit 240 configured to generate the input media signal MIT as illustrated in FIG. 2A such that the signal processing circuit 230 processes the input media signal MIT and generates the output media signal MOT.

When being configured to be one of the media receiving terminals LS1-LS6, the media communication apparatus 110 includes further includes a media playback circuit 250 as illustrated in FIG. 2B, in which the media receiving terminal LS1 is exemplarily illustrated, such that the signal processing circuit 230 processes the input media signal MIL to generate the output media signal MOL. The media playback circuit 250 further playbacks the output media signal MOL.

The detailed configuration and operation of the signal processing circuit 230 under the conditions that the media communication apparatus 110 is configured to be the media providing terminal TL and one of the media receiving terminals LS1-LS6 are respectively described in the following paragraphs.

Figure 3:
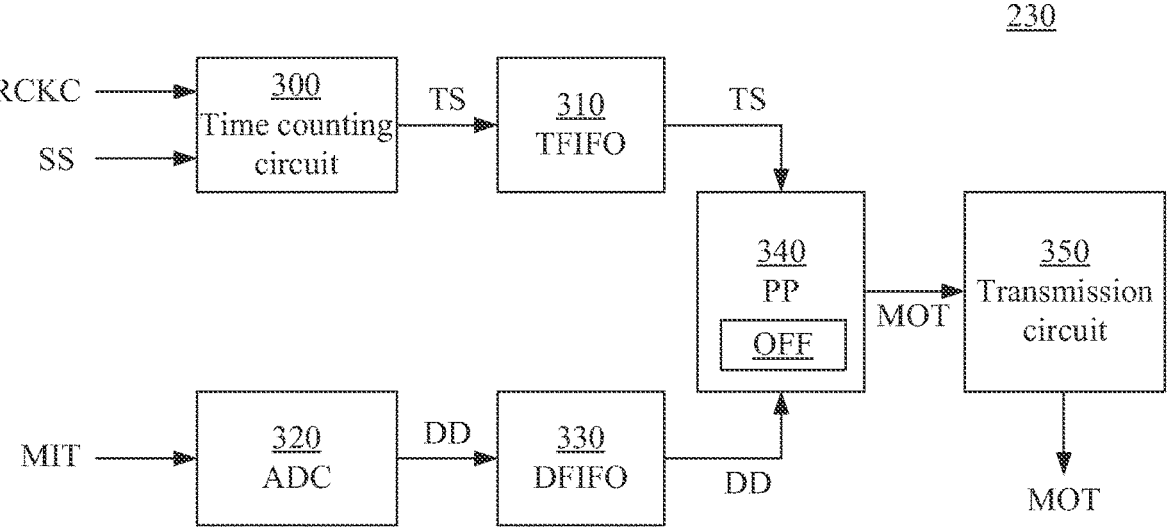
FIG. 3 illustrates a block diagram of the signal processing circuit according to an embodiment of the present invention.

Reference is now made to FIG. 3 at the same time. FIG. 3 illustrates a block diagram of the signal processing circuit 230 according to an embodiment of the present invention. In the present embodiment, the media communication apparatus 110 is configured to be the media providing terminal TL. In the media providing terminal TL, the signal processing circuit 230 includes a time counting circuit 300, a time stamp first-in-first-out circuit 310 (abbreviated as TFIFO in FIG. 3), an analog-to-digital conversion circuit 320 (abbreviated as ADC in FIG. 3), a data first-in-first-out circuit 330 (abbreviated as DFIFO in FIG. 3), a packet processing circuit 340 (abbreviated as PP in FIG. 3) and a transmission circuit 350.

The time counting circuit 300 is configured to perform time counting on the sampling signal SS according to the calibrated the reference clock signal RCKC to generate time stamp information TS corresponding to the standard time domain as the time related information TRI.

The time stamp first-in-first-out circuit 310 is configured to store time stamp information TS.

The analog-to-digital conversion circuit 320 is configured to perform analog-to-digital conversion on the input media signal MIT generated by the media generation circuit 240 in the analog form according to the sampling signal SS to generate digital data DD.

The data first-in-first-out circuit 330 is configured to store the digital data DD.

Since the generation paths of the time stamp information TS and the digital data DD are different, a tiny difference may exist between the timings thereof. As a result, time stamp information TS and digital data DD are stored respectively by the time stamp first-in-first-out circuit 310 and the data first-in-first-out circuit 330 first and accessed respectively by the packet processing circuit 340 subsequently, wherein the time stamp information TS stands for the time spot that the digital data DD is sampled.

The packet processing circuit 340 further generates a plurality of packets according to the corresponding digital data DD and the corresponding time stamp information TS to output the packets as the output media signal MOT. In an embodiment, the packet processing circuit 340 generates the packets based on such as, but not limited to IEEE 1722 protocol. However, the present invention is not limited thereto.

In an embodiment, the packet processing circuit 340 is configured to apply an offset amount OFF to the time stamp information TS so as to generate the packets accordingly with the digital data DD. In an embodiment, the offset amount OFF corresponds to a sum of a maximum delay time of all the paths toward the objects that the digital data DD is transmitted to (e.g., the media receiving terminals LS1-LS6 in FIG. 1) and a small amount of buffering time. The path delays of all the objects that the digital data DD is transmitted to are thus taken into consideration such that the scheduled playback time equals to the sum of the time stamp information TS and the offset amount OFF to guarantee that the playback time spot of the digital data DD of each of the media receiving terminals LS1-LS6 is the same.

The transmission circuit 350 is configured to transmit the output media signal MOT to the media receiving terminals LS1-LS6.

Figure 4:
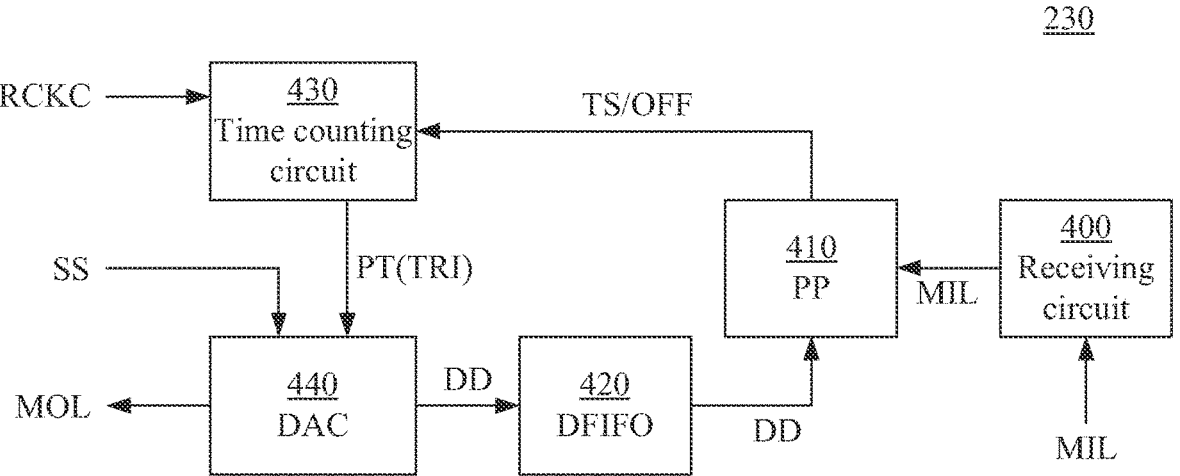
FIG. 4 illustrates a block diagram of the signal processing circuit according to another embodiment of the present invention.

Reference is now made to FIG. 4 at the same time. FIG. 4 illustrates a block diagram of the signal processing circuit 230 according to another embodiment of the present invention. In the present embodiment, the media communication apparatus 110 is configured to be one of the media receiving terminals LS1-LS6. Take the media receiving terminal LS1 as an example. In media receiving terminals LS1, the signal processing circuit 230 includes a receiving circuit 400, a packet processing circuit 410 (abbreviated as PP in FIG. 4), a data first-in-first-out circuit 420 (abbreviated as DFIFO in FIG. 4), a time counting circuit 430 and a digital-to-analog conversion circuit 440 (abbreviated as DAC in FIG. 4).

The receiving circuit 400 is configured to receive the input media signal MIL from the media providing terminal TL. More specifically, the input media signal MIL received by the media receiving terminal LS1 is actually the output media signal MOT transmitted by the media providing terminal TL.

The packet processing circuit 410 is configured to process each of the packets included by the input media signal MIL so as to retrieve the time stamp information TS and the digital data DD.

The data first-in-first-out circuit 420 is configured to store the digital data DD.

The time counting circuit 430 is configured to perform time counting according to the calibrated the reference clock signal RCKC, so as to generate presentation time information PT corresponding to the standard time domain according to the time stamp information TS as the time related information TRI. Since the time stamp information TS itself already corresponds to the standard time domain, the time counting circuit 430 can perform processing corresponding to the time stamp information TS in real time. Further, the time counting circuit 430 only needs to process the first piece of the time stamp information TS. A first-in-first-out circuit configured to store the time stamp information TS is not required.

In an embodiment, the presentation time information PT is actually generated according to the time stamp information TS of each of the packets and the offset amount OFF such that each of the media receiving terminals LS1-LS6 can play the digital data DD at the correct timing corresponding to the same scheduled play time.

The digital-to-analog conversion circuit 440 is configured to receive the sampling signal SS according to the presentation time information PT, so as to perform digital-to-analog conversion on the digital data DD according to the sampling signal SS to generate an analog signal and output the analog signal as the output media signal MOL. The media playback circuit 250 then playbacks the output media signal MOL. In an embodiment, the presentation time information PT acts as an enabling function such that the digital-to-analog conversion circuit 440 receives the sampling signal SS at the time spot corresponding to the presentation time information PT to perform digital-to-analog conversion on the digital data DD.

In some approaches, the media providing terminal generates the time stamp information and the digital data respectively according to a reference clock signal and a sampling clock signal from different sources. The media providing terminal further converts the time stamp information to the standard time domain when the packets are processed so as to generate packets corresponding to the standard time domain according to the time stamp information and the digital data. Based on the same clock signal configuration, the media receiving terminals not only needs to dispose an additional first-in-first-out circuit for storing the time stamp information, but also needs to dispose a clock recovery circuit to convert the time stamp information from the standard time domain to an internal time domain and adjust the internal clock signals according to the standard time domain to process the digital data. The circuit cost is thus increased greatly.

The media communication apparatus of the present invention calibrates the reference clock signal and the sampling clock signal from the same source to be aligned with a standard time domain by disposing the time calibration circuit such that the generated time related information corresponds to the standard time domain to process the input media signal without an additional time domain conversion circuit. The circuit cost can be greatly reduced.

It is appreciated that in the circuits illustrated in FIG. 2A, FIG. 2B, FIG. 3 and FIG. 4, part of the circuits can be fully implemented by hardware circuits and integrated in the same circuit block. Part of the circuits can be implemented by software operated on a circuit configured to be a processing unit.

For example, in the media providing terminal TL, the local clock generation circuit 200, the media clock processing circuit 220, the time counting circuit 300 and the transmission circuit 350 can be implemented by hardware circuits and be integrated as a physical layer circuit (PHY). The time calibration circuit 210, the time stamp first-in-first-out circuit 310 and the packet processing circuit 340 can be implemented by software or firmware operated by a processing circuit. The analog-to-digital conversion circuit 320 and the data first-in-first-out circuit 330 can be implemented by hardware circuits and be integrated as a signal processing circuit.

In each of the media receiving terminals LS1-LS6, the local clock generation circuit 200, the media clock processing circuit 220, the receiving circuit 400 and the time counting circuit 430 can be implemented by hardware circuits and be integrated as a physical layer circuit. The time calibration circuit 210 and the packet processing circuit 410 can be implemented by software or firmware operated by a processing circuit. The data first-in-first-out circuit 420 and the digital-to-analog conversion circuit 440 can be implemented by hardware circuits and be integrated as a signal processing circuit.

It is appreciated that the circuit configuration described above is merely an example. In other embodiments, other hardware and software configurations and integrations can be used. The present invention is not limited thereto.

Reference is now made to FIG. 5. FIG. 5 illustrates a flow chart of a media communication method 500 according to an embodiment of the present invention.

Besides the apparatus described above, the present invention further discloses the media communication method 500 that can be used in such as, but not limited to the media communication apparatus 110 illustrated in FIG. 2A or FIG. 2B. An embodiment of the media communication method 500 is illustrated in FIG. 5 and includes the steps outlined below.

In step S510, the reference clock signal RCK and the media clock signal MCK are generated by the local clock generation circuit 200.

In step S520, the time calibration process is performed with the external apparatus by the time calibration circuit 210 to generate the time calibration information TC so as to further calibrate the reference clock signal RCK and the media clock signal MCK according to the time calibration information TC to respectively generate the calibrated reference clock signal RCKC and the calibrated media clock signal MCKC on the standard time domain.

In step S530, the sampling signal SS is generated according to the calibrated media clock signal MCKC by the media clock processing circuit 220.

In step S540, time counting is performed according to the calibrated reference clock signal RCKC to generate the time related information TRI by the signal processing circuit 230, so as to process the input media signal (e.g., the input media signal MIT of the media providing terminal TL of the input media signal MIL of each of the media receiving terminals LS1-LS6) according to the time related information TRI and the sampling signal SS to generate the output media signal (the output media signal MOT of the media providing terminal TL or the input media signal MOL of each of the media receiving terminals LS1-LS6).

It is appreciated that the embodiments described above are merely an example. In other embodiments, it is appreciated that many modifications and changes may be made by those of ordinary skill in the art without departing, from the spirit of the invention.

In summary, the media communication system, the media communication apparatus and the media communication method thereof having built-in signal synchronization mechanism calibrate the reference clock signal and the sampling clock signal to be aligned with a standard time domain by disposing the time calibration circuit such that the generated time related information corresponds to the standard time domain to process the input media signal without an additional time domain conversion circuit. The circuit cost can be greatly reduced.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A media communication apparatus having signal synchronization mechanism comprising:
   a local clock generation circuit configured to generate a reference clock signal and a media clock signal;
   a time calibration circuit configured to perform a time calibration process with an external apparatus so as to generate time calibration information so as to further calibrate the reference clock signal and the media clock signal according to the time calibration information to respectively generate a calibrated reference clock signal and a calibrated media clock signal on a standard time domain;
   a media clock processing circuit configured to generate a sampling signal according to the calibrated media clock signal; and
   a signal processing circuit configured to perform time counting according to the calibrated reference clock signal to generate time related information, so as to process an input media signal according to the time related information and the sampling signal to generate an output media signal.

2. The media communication apparatus of claim 1, wherein the media communication apparatus is a media providing terminal and further comprises a media generation circuit configured to generate the input media signal, the signal processing circuit comprises:
   a time counting circuit configured to perform time counting on the sampling signal according to the calibrated reference clock signal to generate time stamp information corresponding to the standard time domain as the time related information;
   an analog-to-digital conversion circuit configured to perform analog-to-digital conversion on the input media signal according to the sampling signal to generate digital data;
   a packet processing circuit configured to generate a plurality of packets according to the corresponding digital data and the corresponding time stamp information to output the packets as the output media signal; and
   a transmission circuit configured to transmit the output media signal to a media receiving terminal.

3. The media communication apparatus of claim 2, wherein the signal processing circuit further comprises:
   a time stamp first-in-first-out circuit configured to store the time stamp information; and
   a data first-in-first-out circuit configured to store the digital data;
   wherein the packet processing circuit is configured to retrieve the time stamp information and the digital data respectively from the time stamp first-in-first-out circuit and the data first-in-first-out circuit to generate the packets.

4. The media communication apparatus of claim 3, wherein the packet processing circuit is configured to apply an offset amount to the time stamp information so as to generate the packets accordingly with the digital data.

5. The media communication apparatus of claim 1, wherein the media communication apparatus is a media receiving terminal and further comprises a media playback circuit configured to playback the output media signal, the signal processing circuit comprises:

a receiving circuit configured to receive the input media signal from a media providing terminal;

a packet processing circuit configured to process each of a plurality of packets comprised by the input media signal so as to retrieve time stamp information and digital data therefrom;

a time counting circuit configured to perform time counting according to the calibrated reference clock signal, so as to generate presentation time information corresponding to the standard time domain according to the time stamp information as the time related information; and a digital-to-analog conversion circuit configured to receive the sampling signal according to the presentation time information, so as to perform digital-to-analog conversion on the digital data according to the sampling signal to generate an analog signal and output the analog signal as the output media signal.

6. The media communication apparatus of claim 5, wherein the signal processing circuit further comprises a data first-in-first-out circuit configured to store the digital data;

the digital-to-analog conversion circuit is configured to access the digital data from the data first-in-first-out circuit to perform digital-to-analog conversion.

7. The media communication apparatus of claim 6, wherein the presentation time information is actually generated from the time stamp information and an offset amount of each of the packets.

8. The media communication apparatus of claim 1, wherein the time calibration circuit perform the time calibration process with the external apparatus according to a generalized time precision protocol.

9. A media communication method having signal synchronization mechanism used in a media communication apparatus, comprising:

generating a reference clock signal and a media clock signal by a local clock generation circuit;

performing a time calibration process with an external apparatus by a time calibration circuit to generate time calibration information so as to further calibrate the reference clock signal and the media clock signal according to the time calibration information to respectively generate a calibrated reference clock signal and a calibrated media clock signal on a standard time domain;

generating a sampling signal according to the calibrated media clock signal by a media clock processing circuit; and performing time counting according to the calibrated reference clock signal to generate time related information by a signal processing circuit, so as to process an input media signal according to the time related information and the sampling signal to generate an output media signal.

10. The media communication method of claim 9, wherein the media communication apparatus is a media providing terminal, the media communication method further comprising:

generating the input media signal by a media generation circuit further comprised by the media communication apparatus;

performing time counting on the sampling signal according to the calibrated reference clock signal to generate time stamp information corresponding to the standard time domain as the time related information by a time counting circuit;

performing analog-to-digital conversion on the input media signal according to the sampling signal to generate digital data by an analog-to-digital conversion circuit;

generating a plurality of packets according to the corresponding digital data and the corresponding time stamp information to output the packets as the output media signal by a packet processing circuit; and transmitting the output media signal to a media receiving terminal by a transmission circuit.

11. The media communication method of claim 10, further comprising:

storing the time stamp information by a time stamp first-in-first-out circuit;

storing the digital data by a data first-in-first-out circuit; and retrieving the time stamp information and the digital data respectively from the time stamp first-in-first-out circuit and the data first-in-first-out circuit to generate the packets by the packet processing circuit.

12. The media communication method of claim 11, further comprising:

applying an offset amount to the time stamp information by the packet processing circuit so as to generate the packets accordingly with the digital data.

13. The media communication method of claim 9, wherein the media communication method is a media receiving terminal, the media communication method further comprising:

receiving the input media signal from a media providing terminal by a receiving circuit;

processing each of a plurality of packets comprised by the input media signal so as to retrieve time stamp information and digital data therefrom by a packet processing circuit;

performing time counting according to the calibrated reference clock signal by a time counting circuit, so as to generate presentation time information corresponding to the standard time domain according to the time stamp information as the time related information;

receiving the sampling signal according to the presentation time information by a digital-to-analog conversion circuit, so as to perform digital-to-analog conversion on the digital data according to the sampling signal to generate an analog signal and output the analog signal as the output media signal; and playbacking the output media signal by a media playback circuit further comprised by the media communication apparatus.

14. The media communication method of claim 13, further comprising:

storing the digital data by a data first-in-first-out circuit further comprised by the signal processing circuit; and accessing the digital data from the data first-in-first-out circuit to perform digital-to-analog conversion by the digital-to-analog conversion circuit.

15. The media communication method of claim 14, wherein the presentation time information is actually generated from the time stamp information and an offset amount of each of the packets.

16. The media communication method of claim 9, further comprising:

the time calibration circuit perform the time calibration process with the external apparatus according to a generalized time precision protocol.

17. A media communication system comprising:

a media providing terminal and a plurality of media receiving terminals each comprising:

a local clock generation circuit configured to generate a reference clock signal and a media clock signal;

a time calibration circuit configured to perform a time calibration process with an external apparatus to generate time calibration information so as to further calibrate the reference clock signal and the media clock signal according to the time calibration information to respectively generate a calibrated reference clock signal and a calibrated media clock signal on a standard time domain;

a media clock processing circuit configured to generate a sampling signal according to the calibrated media clock signal; and a signal processing circuit configured to perform time counting according to the calibrated reference clock signal to generate time related information, so as to process an input media signal according to the time related information and the sampling signal to generate an output media signal;

wherein the output media signal generated by the media providing terminal generate serves as the input media signal of the media receiving terminals.

18. The media communication system of claim 17, wherein the media providing terminal further comprises a media generation circuit configured to generate the input media signal, the signal processing circuit of the media providing terminal comprises:

a time counting circuit configured to perform time counting on the sampling signal according to the calibrated reference clock signal to generate time stamp information corresponding to the standard time domain as the time related information;

an analog-to-digital conversion circuit configured to perform analog-to-digital conversion on the input media signal according to the sampling signal to generate digital data;

a packet processing circuit configured to generate a plurality of packets according to the corresponding digital data and the corresponding time stamp information to output the packets as the output media signal; and a transmission circuit configured to transmit the output media signal to a media receiving terminal.

19. The media communication system of claim 17, wherein each of the media receiving terminals further comprises a media playback circuit configured to playback the output media signal, the signal processing circuit of each of the media receiving terminals comprises:

a receiving circuit configured to receive the input media signal from a media providing terminal;

a packet processing circuit configured to process each of a plurality of packets comprised by the input media signal so as to retrieve time stamp information and digital data therefrom;

a time counting circuit configured to perform time counting according to the calibrated reference clock signal, so as to generate presentation time information corresponding to the standard time domain according to the time stamp information as the time related information; and a digital-to-analog conversion circuit configured to receive the sampling signal according to the presentation time information, so as to perform digital-to-analog conversion on the digital data according to the sampling signal to generate an analog signal and output the analog signal as the output media signal.

20. The media communication system of claim 17, wherein the time calibration circuit perform the time calibration process with the external apparatus according to a generalized time precision protocol.

* * * * *